United States Patent
Nakaoka

(10) Patent No.: US 11,010,243 B2
(45) Date of Patent: May 18, 2021

(54) MEMORY APPARATUS WITH ERROR BIT CORRECTION IN DATA READING PERIOD

(71) Applicant: Winbond Electronics Corp., Taichung (TW)

(72) Inventor: Yuji Nakaoka, Kanagawa (JP)

(73) Assignee: Winbond Electronics Corp., Taichung (TW)

(*) Notice: Subject to any disclaimer, the term of this patent is extended or adjusted under 35 U.S.C. 154(b) by 71 days.

(21) Appl. No.: 16/565,453

(22) Filed: Sep. 9, 2019

(65) Prior Publication Data
US 2021/0073071 A1    Mar. 11, 2021

(51) Int. Cl.
*G06F 11/00* (2006.01)
*G06F 11/10* (2006.01)
(Continued)

(52) U.S. Cl.
CPC ...... *G06F 11/1068* (2013.01); *G11C 11/4094* (2013.01); *G11C 11/4096* (2013.01);
(Continued)

(58) Field of Classification Search
CPC ........ G11C 2029/0411; G11C 11/5642; G11C 29/42; G11C 2013/0076;
(Continued)

(56) References Cited

U.S. PATENT DOCUMENTS

| | | | | |
|---|---|---|---|---|
| 7,810,017 B2 * | 10/2010 | Radke | ................... | H03M 13/05 714/769 |
| 8,151,173 B2 * | 4/2012 | Hirose | ................ | G06F 11/1048 714/785 |

(Continued)

FOREIGN PATENT DOCUMENTS

| | | |
|---|---|---|
| CN | 103531246 | 10/2016 |
| JP | H07073114 | 3/1995 |

(Continued)

OTHER PUBLICATIONS

"Office Action of Japan Counterpart Application", dated Aug. 18, 2020, p. 1-p. 3.
(Continued)

*Primary Examiner* — Esaw T Abraham
(74) *Attorney, Agent, or Firm* — JCIPRNET

(57) ABSTRACT

In a memory apparatus, a data read-write circuit is configured to access data in a memory cell array. A parity-data read-write circuit is configured to access parity data in a parity memory cell array. A syndrome operation circuit generates an error decoding signal according to the data received from the data read-write circuit and the parity data received from the parity data read-write circuit. During the same read period as reading the data, the data read-write circuit corrects an error bit of the data and outputs the corrected data and a correction bit signal according to the error decoding signal. The syndrome operation circuit further outputs a parity data writing signal to the parity data read-write circuit according to the correction bit signal to update the parity data in the parity memory cell array. The data read-write circuit also writes the corrected data back to the memory cell array.

17 Claims, 14 Drawing Sheets

(51) Int. Cl.
*G11C 11/4096* (2006.01)
*G11C 29/52* (2006.01)
*G11C 11/4094* (2006.01)
*H03K 19/21* (2006.01)
*H03K 19/20* (2006.01)

(52) U.S. Cl.
CPC .............. *G11C 29/52* (2013.01); *H03K 19/20* (2013.01); *H03K 19/21* (2013.01)

(58) Field of Classification Search
CPC ........... G11C 2211/4062; G11C 7/1045; G06F 11/1068; G06F 11/1076; G06F 11/108; H03M 13/1171; H03M 13/11
See application file for complete search history.

(56) References Cited

U.S. PATENT DOCUMENTS

| | | | | |
|---|---|---|---|---|
| 8,438,344 | B2* | 5/2013 | Kumar | G11C 8/06 711/155 |
| 8,848,465 | B2* | 9/2014 | Kim | G11C 7/02 365/189.15 |
| 9,148,176 | B2* | 9/2015 | Zhang | G06F 3/064 |
| 9,164,834 | B2 | 10/2015 | Chung et al. | |
| 9,985,659 | B2* | 5/2018 | Park | H03M 13/152 |
| 10,379,947 | B2* | 8/2019 | Lee | G11C 29/14 |
| 10,445,175 | B2* | 10/2019 | Ha | G06F 11/1012 |
| 2008/0034270 | A1* | 2/2008 | Onishi | G06F 11/1048 714/758 |
| 2009/0089646 | A1* | 4/2009 | Hirose | G11C 7/106 714/766 |
| 2011/0099459 | A1* | 4/2011 | Nakamura | G11C 7/1006 714/763 |
| 2012/0213016 | A1 | 8/2012 | Iida | |

FOREIGN PATENT DOCUMENTS

| | | |
|---|---|---|
| JP | 2015167058 | 9/2015 |
| KR | 20140126225 | 10/2014 |
| KR | 101873526 | 7/2018 |
| TW | 201729213 | 8/2017 |

OTHER PUBLICATIONS

"Office Action of Korea Counterpart Application" with English translation thereof, dated Mar. 18, 2020, p. 1-p. 8.
"Office Action of Taiwan Counterpart Application," dated Dec. 3, 2019, p. 1-p. 8.

* cited by examiner ly used in various electronic apparatuses. In order to improve data reliability of the DRAMs, some DRAMs are equipped with error correction code (ECC) memory to detect an error bit of the stored data and correct the error bit. At present, the DRAMs mainly adopt a single error correction technology, whereby only one-bit error can be corrected at a time. If the stored data have 2-bit error or more, the error correction function of the ECC circuit will be invalid. However, when the DRAMs are being operated, the error bit caused by a soft error may be generated due to a high temperature or a refresh. It the error bits cannot be timely corrected, it may cause the stored data to accumulate two error bits, so that the data reliability of the memory is reduced. Therefore, how to timely correct the stored data to avoid the error bit from being accumulated to two or more error bits and ensure the accuracy of data in the DRAMs has become an issue to be overcome.

MEMORY APPARATUS WITH ERROR BIT CORRECTION IN DATA READING PERIOD

BACKGROUND

Technical Field

The disclosure relates to a memory apparatus; more particularly, the disclosure relates to a memory apparatus characterized by an error checking and correction function.

Description of Related Art

With the advancement of science and technology, consumers' demands for storage media have increased rapidly. Among them, dynamic random access memories (DRAMs) having advantages of simple structure, high density, and low costs have been widely used in various electronic apparatuses. In order to improve data reliability of the DRAMs, some DRAMs are equipped with error correction code (ECC) memory to detect an error bit of the stored data and correct the error bit. At present, the DRAMs mainly adopt a single error correction technology, whereby only one-bit error can be corrected at a time. If the stored data have 2-bit error or more, the error correction function of the ECC circuit will be invalid. However, when the DRAMs are being operated, the error bit caused by a soft error may be generated due to a high temperature or a refresh. It the error bits cannot be timely corrected, it may cause the stored data to accumulate two error bits, so that the data reliability of the memory is reduced. Therefore, how to timely correct the stored data to avoid the error bit from being accumulated to two or more error bits and ensure the accuracy of data in the DRAMs has become an issue to be overcome.

SUMMARY

The disclosure provides a memory apparatus capable of instantly correcting error bits in a data reading period as well as updating stored data and parity data for checking and correcting errors.

In an embodiment of the disclosure, a memory apparatus includes a data read-write circuit, a parity data read-write circuit, and a syndrome operation circuit. The data read-write circuit is coupled to a memory cell array and configured to access data in the memory cell array. The parity data read-write circuit is coupled to a parity memory cell array and configured to access parity data in the parity memory cell array. The syndrome operation circuit generates an error decoding signal according to the data received from the data read-write circuit and the parity data received from the parity data read-write circuit, wherein during the same reading period as reading the data, the data read-write circuit corrects an error bit of the data and outputs the corrected data and a correction bit signal according to the error decoding signal, wherein the data read-write circuit writes the corrected data back to the memory cell array, wherein the syndrome operation circuit further outputs a parity data writing signal to the parity data read-write circuit according to the correction bit signal, so as to update the parity data in the parity memory cell array.

In view of the above, the memory apparatus provided in one or more embodiments of the disclosure can read data from the memory cell array and complete checking and correction operations in one reading period. When one error bit of the data is found, the memory apparatus provided in one or more embodiments of the disclosure can instantly correct the error bit of the same reading period, so as to output the corrected data, and the memory apparatus can correspondingly write the corrected data back to the memory cell array and write the updated parity data back to the parity memory cell array in a continuous period. Thereby, the memory apparatus provided herein can have the improved data reliability.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1:
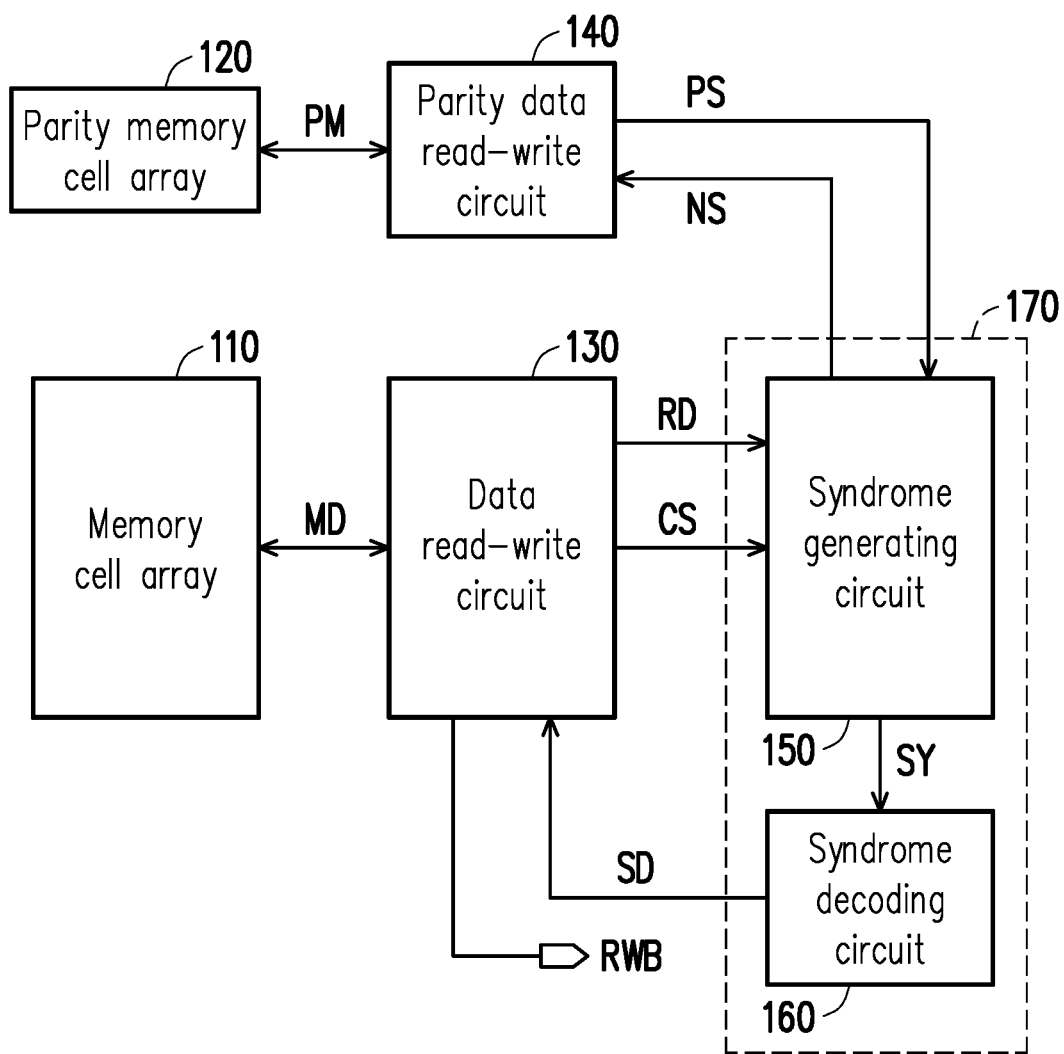
FIG. 1 is a block diagram illustrating a memory apparatus according to an embodiment of the disclosure.

FIG. 1 is a block diagram illustrating a memory apparatus according to an embodiment of the disclosure. With reference to FIG. 1, a memory apparatus 100 includes a memory cell array 110, a parity memory cell array 120, a data read-write circuit 130, a parity data read-write circuit 140, and a syndrome operation circuit 170, wherein the syndrome operation circuit 170 includes a syndrome generating circuit 150 and a syndrome decoding circuit 160. The data read-write circuit 130 is coupled to the memory cell array 110 to access data MD of the memory cell array 110. The parity data read-write circuit 140 is coupled to the parity memory cell array 120 to access parity data PM of the parity memory cell array 120. The parity data PM are error checking and correction codes configured to check and correct the data MD and generated by performing ECC encoding programs (e.g., Hamming code) on the data MD, for instance. The number of bits in the parity data PM is determined by the number of bits in the data MD. In this embodiment, the number of bits in the data MD is 64, for instance, and the number of bits in the parity data PM is correspondingly set as 7; however, the number of bits in the data MD and the number of bits in the parity data PM should not be construed as limitations in the disclosure.

According to the data MD received from the data read-write circuit 130 (the data read-write circuit 130 reads the data MD and then outputs a reading bit signal RD) and the parity data PM received from the parity data read-write circuit 140 (the parity data read-write circuit 140 reads the parity data PM and then outputs a parity reading signal PS), the syndrome operation circuit 170 generates an error decoding signal SD, wherein during the same reading period of reading the data MD, the data read-write circuit 130 corrects an error bit of the parity data MD and outputs the corrected data (i.e., a data output signal RWB) and a correction bit signal CS according to the error decoding signal SD. The data read-write circuit 130 writes the corrected data back to the memory cell array 110, and the syndrome operation circuit 170 outputs a parity data writing signal NS to the parity data read-write circuit 140 according to the correction bit signal CS, so as to update the parity data PM in the parity memory cell array 120.

That is, according to the embodiment, after the data MD and the parity data PM are read, whether there is any error bit of the data MD can be checked through performing a syndrome encoding operation and a syndrome decoding operation by the syndrome operation circuit 170. If there exists any error bit, the data read-write circuit 130 can, in the same reading period, instantly correct the error bit according to the error decoding signal SD to output the corrected data output signal RWB and can also output the correction bit signal CS to the syndrome operation circuit 170, so as to allow the parity data read-write circuit 140 to update the parity data PM. In the period from reading the data MD to outputting the corrected data output signal RWB, the memory apparatus 100 need not again select the memory cells of the memory cell array 110 but can complete said operations in the same reading period and can also update the parity data PM.

Figure 2:
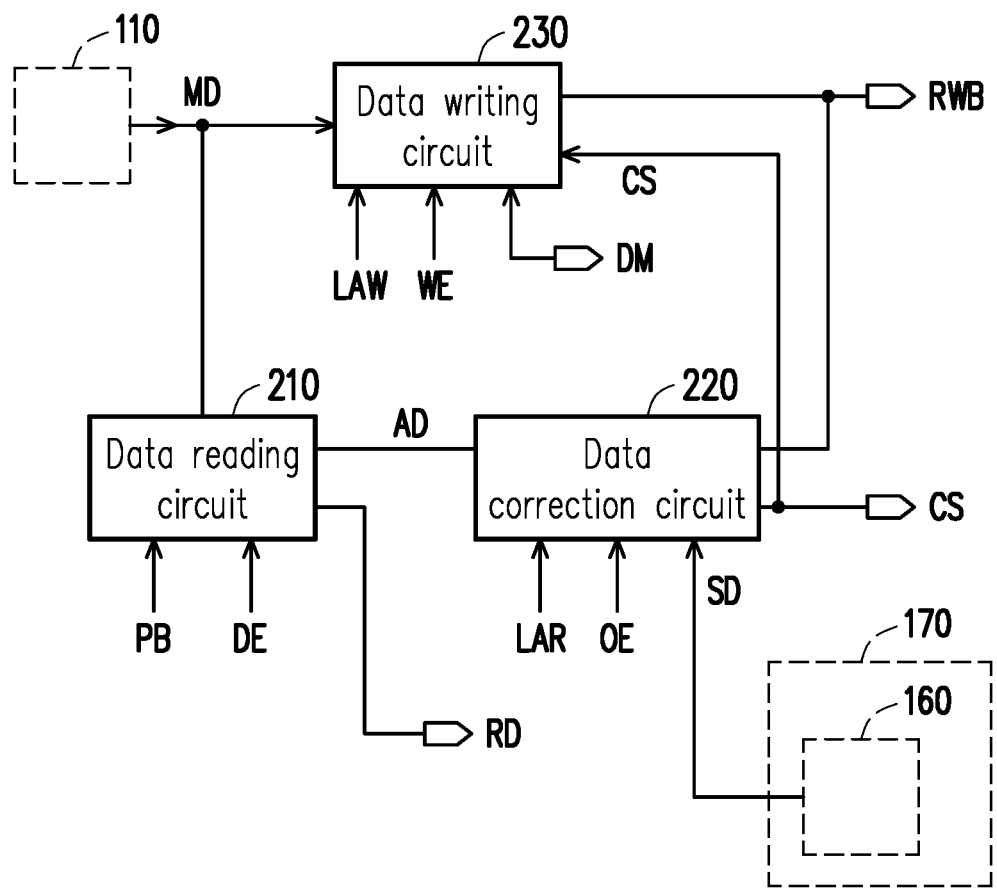
FIG. 2 is a schematic circuit block diagram illustrating a data read-write circuit according to an embodiment of the disclosure.

The circuit structure and the implementation manner provided in this embodiment are further explained below. FIG. 2 is a schematic circuit block diagram illustrating a data read-write circuit according to an embodiment of the disclosure. With reference to FIG. 2, the data read-write circuit 130 includes a data reading circuit 210, a data correction circuit 220, and a data writing circuit 230. The data reading circuit 210 is coupled to the memory cell array 110 and configured to read the data MD from the memory cell array 110, so as to generate the read data AD and the corresponding reading bit signal RD. The data correction circuit 220 is coupled to the data reading circuit 210 and a syndrome decoding circuit 160 of the syndrome operation circuit 170 and configured to latch the read data AD in the reading period and correct the error bit of the read data AD according to the error decoding signal SD, so as to generate the corrected data output signal RWB and the correction bit signal CS, wherein the data output signal RWB is an output result obtained from reading and correcting the data MD by the data read-write circuit 130. The data writing circuit 230 is coupled to the data correction circuit 220 and the memory cell array 110 and configured to replace the data output signal RWB corresponding to the error bit with the correction bit signal CS, so as to write the corrected data MD back to the memory cell array 110.

As shown in FIG. 1, the syndrome operation circuit 170 includes a syndrome generating circuit 150 and a syndrome decoding circuit 160. The syndrome generating circuit 150 is coupled to the data read-write circuit 130 and the parity data read-write circuit 140 and selects to receive the data reading circuit 210 or an output signal of the data correction circuit 220 according to the reading operation or the writing operation, so as to generate the parity data writing signal NS. Specifically, when the data read-write circuit 130 performs the reading operation, the syndrome generating circuit 150 generates the parity data writing signal NS according to the reading bit signal RD, and when the data read-write circuit 130 performs the writing operation, the syndrome generating circuit 150 generates the parity data writing signal NS according to the correction bit signal CS or the data output signal RWB.

The syndrome generating circuit 150 compares the parity data writing signal NS with the corresponding parity data PM (the parity data read-write circuit 140 reads the parity data PM to provide the syndrome generating circuit 150 with the parity reading signal PS), so as to generate a syndrome signal SY. The syndrome decoding circuit 160 is coupled to the syndrome generating circuit 150 to decode the syndrome signal SY and generate the error decoding signal SD. The data read-write circuit 130 corrects the error bit of the data MD according to the error decoding signal SD.

Figure 3A:
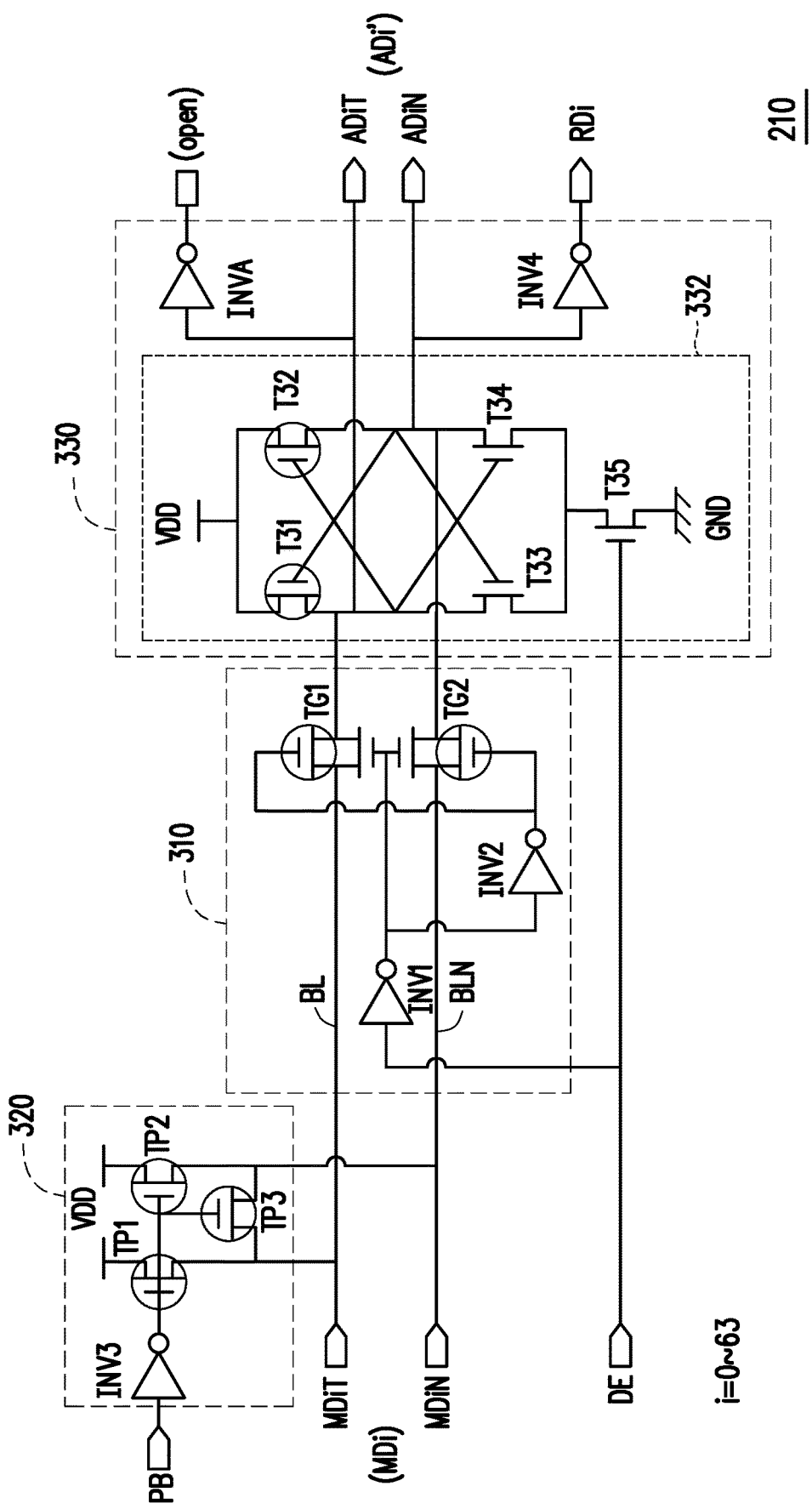
FIG. 3A is a schematic circuit diagram illustrating a data read-write circuit according to an embodiment of the disclosure.
Figure 3B:
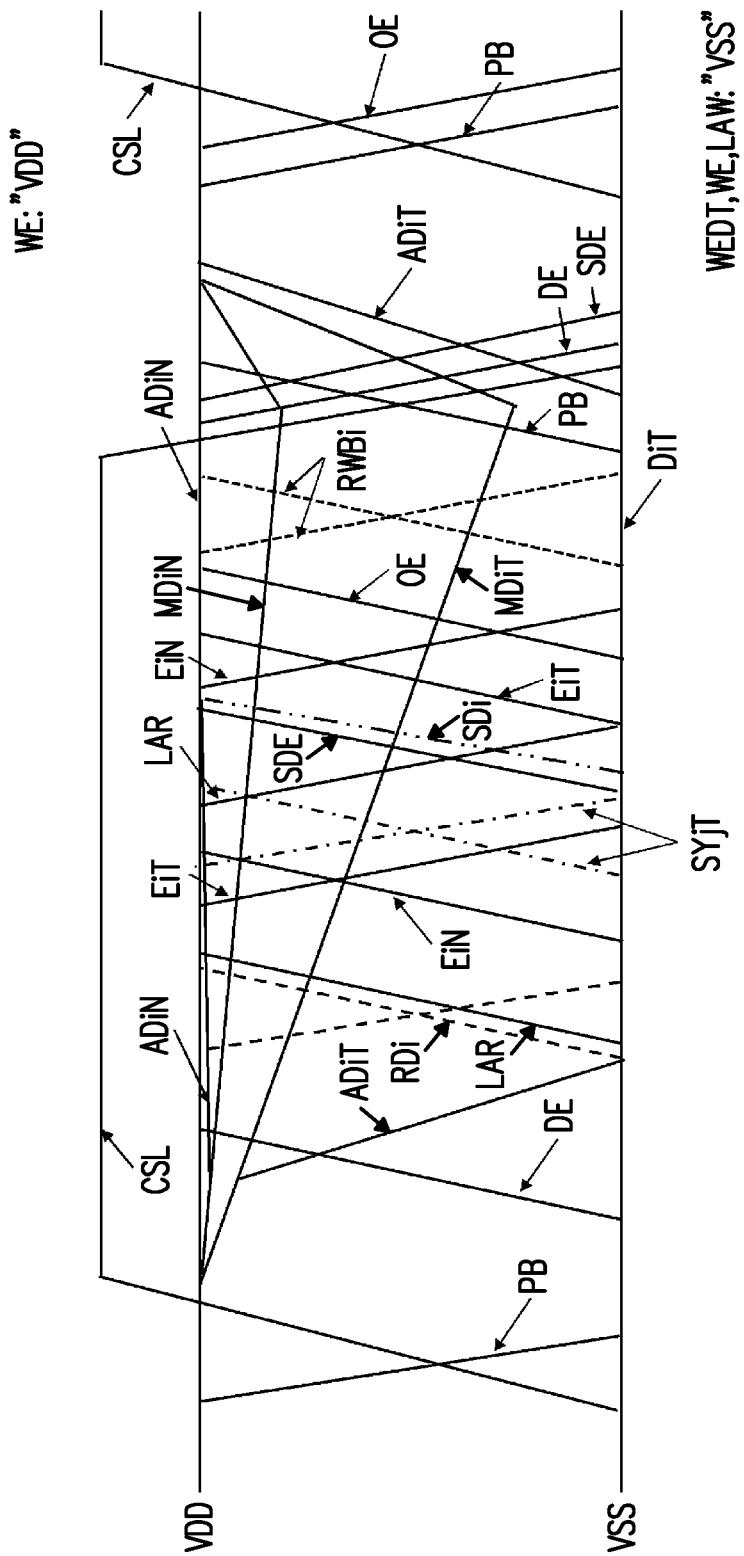
FIG. 3B is a schematic diagram illustrating a waveform of a reading operation of a memory apparatus according to an embodiment of the disclosure.
Figure 4:
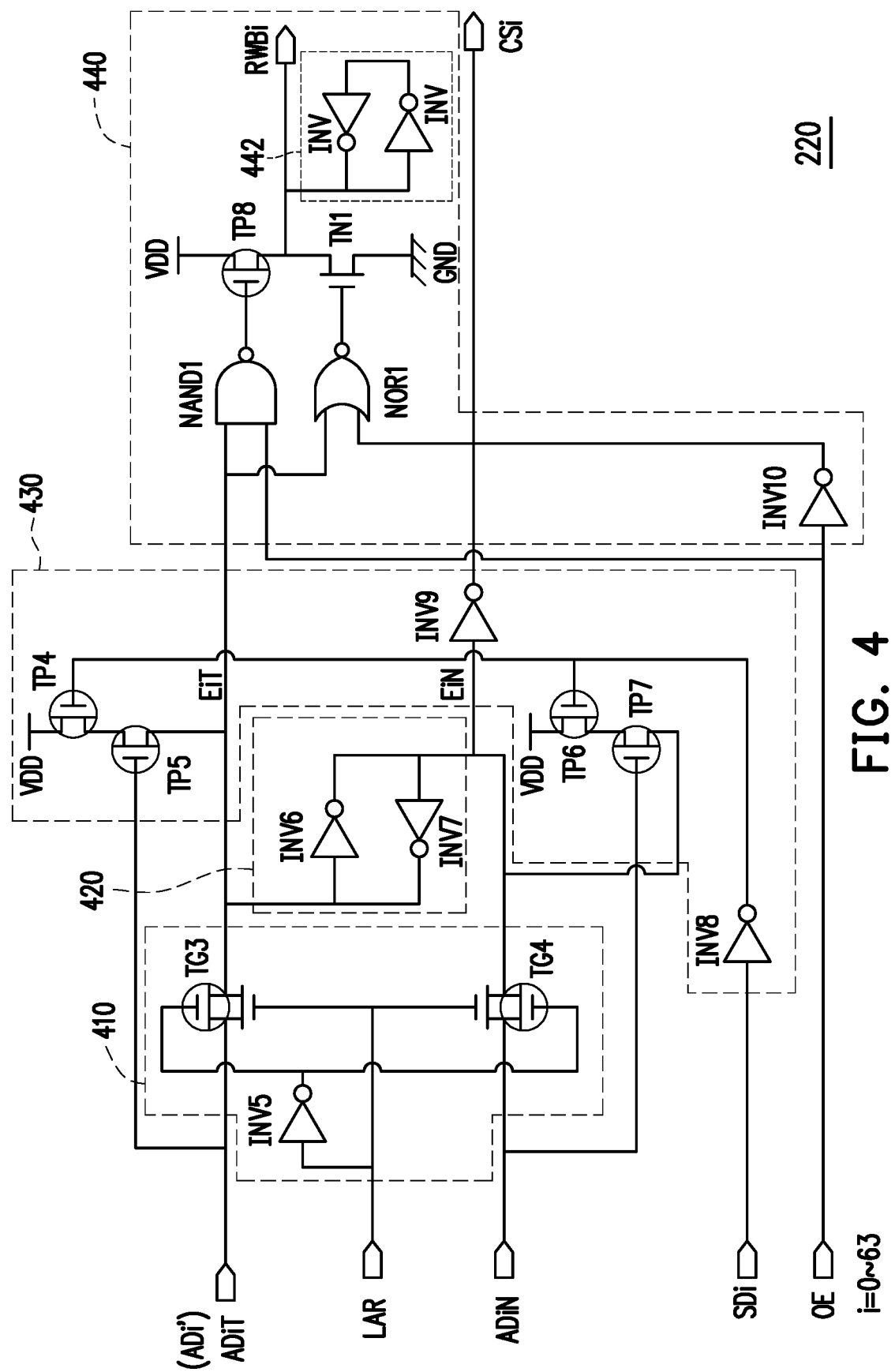
FIG. 4 is a schematic circuit diagram illustrating a data correction circuit according to an embodiment of the disclosure.
Figure 5A:
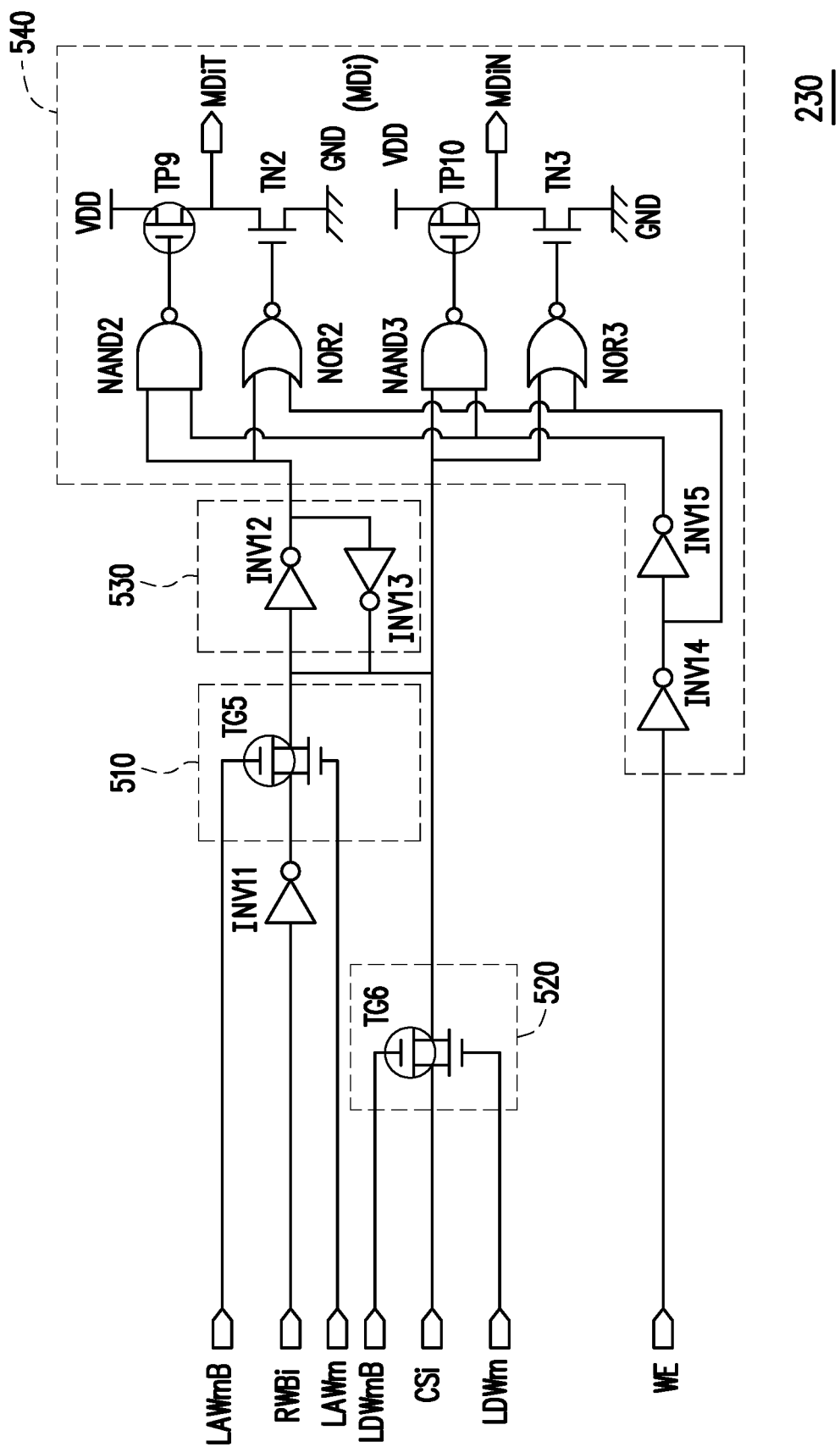
FIG. 5A is a schematic circuit diagram illustrating a data writing circuit according to an embodiment of the disclosure.
Figure 5B:
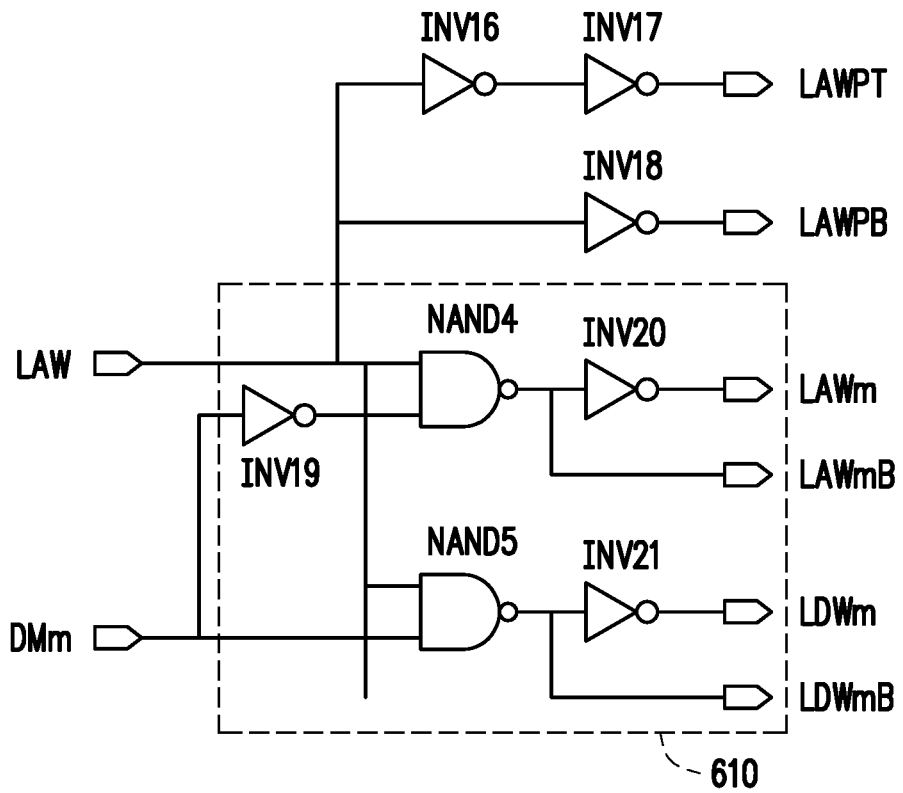
FIG. 5B is a schematic circuit diagram illustrating a control signal generating circuit of a data writing circuit according to an embodiment of the disclosure.

The specific implementation manner of the data read-write circuit 130 is explained hereinafter. FIG. 3A is a schematic circuit diagram illustrating a data read-write circuit according to an embodiment of the disclosure. FIG. 3B is a schematic diagram illustrating a waveform of a reading operation of a memory apparatus according to an embodiment of the disclosure. FIG. 4 is a schematic circuit diagram illustrating a data correction circuit according to an embodiment of the disclosure. FIG. 5A is a schematic circuit diagram illustrating a data writing circuit according to an embodiment of the disclosure. FIG. 5B is a schematic circuit diagram illustrating a control signal generating circuit of a data writing circuit according to an embodiment of the disclosure. The implementation details of the data read-write circuit 130 are specified with reference to FIG. 1, FIG. 2, and FIG. 3A to FIG. 5B.

In FIG. 3A, the data reading circuit 210 includes a reading switch 310, a pre-charging circuit 320, and an amplification circuit 330. An input terminal of the reading switch 310 receives the data MD from the memory cell array 110 and is controlled by a reading enabling signal DE to be switched on or off. The pre-charging circuit 320 is coupled to the input terminal of the reading switch 310 and controlled by the pre-charging signal PB, so as to perform a pre-charging operation on the input terminal of the reading switch 310. An input terminal of the amplification circuit 330 is coupled to an output terminal of the reading switch 310, controlled by the reading enabling signal DE to generate the read data AD and the corresponding reading bit signal RD.

Specifically, a sensing amplifier of the memory cell array 110 outputs the data MD stored in the memory cells in form of a differential signal, and therefore the data MD include the differential signal of a data signal MDiT and a phase-inverting data signal MDiN, wherein the data MD is 64 bits, for instance. In the disclosure, MDi represents one bit of the data MD, and i is an integer from 0 to 63 (i=0, 1, 2 . . . , or 63), e.g., MD0, MD1, . . . , MD63. Similarly, the read data AD include the differential signal of a reading data signal ADiT and a phase-inverting reading data signal ADiN. In the disclosure, i indicates a corresponding bit; for instance, the reading bit signal RDi, the data output signal RWBi, and the correction bit signal CSi represent the corresponding bit in the reading bit signal RD, the data output signal RWB, and the correction bit signal CS, and the rest can be deduced therefrom.

In the reading switch 310, a transmission gate TG1 is coupled to a bit line BL to receive the data signal MDiT, a transmission gate TG2 is coupled to a complementary bit line BLN to receive the phase-inverting data signal MDiN, and the transmission gate TG1 and the transmission gate TG2 are both controlled by the reading enabling signal DE. A phase inverter INV1 depicted in FIG. 3A has an input terminal receiving the reading enabling signal DE and an output terminal collectively coupled to one control terminal of one of the transmission gate TG1 and the transmission gate TG2 (e.g., the control terminal of the n-type transistor of the transmission gate TG1 and the transmission gate TG2). A phase inverter INV2 has an input terminal coupled to the output terminal of the phase inverter INV1 and an output terminal collectively coupled to the other control terminal of the transmission gate TG1 or the transmission gate TG2 (e.g., the control terminal of the p-type transistor of the transmission gate TG1 and the transmission gate TG2).

In the pre-charging circuit 320, a phase inverter INV3 receives the pre-charging signal PB. A p-type transistor TP1 has a first terminal coupled to a supply voltage VDD, a control terminal coupled to an output terminal of the phase inverter INV3, and a second terminal coupled to the bit line BL. A p-type transistor TP2 has a first terminal coupled to the supply voltage VDD, a control terminal coupled to the output terminal of the phase inverter INV3, and a second terminal coupled to the complementary bit line BLN. A p-type transistor TP3 is coupled between the second terminal of the p-type transistor TP1 and the second terminal of the p-type transistor TP2 and has a control terminal coupled to the output terminal of the phase inverter INV3.

In the amplification circuit 330, an amplifier 332 is coupled to the reading switch 310 to receive the data signal MDiT and the phase-inverting data signal MDiN and correspondingly output the reading data signal ADiT and the phase-inverting reading data signal ADiN. A phase inverter INV4 receives the phase-inverting reading data signal ADiN to output the reading bit signal RDi.

In this embodiment, the amplifier 332 includes, for instance, p-type transistors T31-T32 and n-type transistors T33-T35. The p-type transistor T31 and the n-type transistor T33 are serially connected between a supply voltage VDD and a first terminal of the n-type transistor T35, and the p-type transistor T32 and the n-type transistor T34 are also serially connected between the supply voltage VDD and the first terminal of the n-type transistor T35, wherein a control terminal of the p-type transistor T31 and a control terminal of the n-type transistor T33 are collectively coupled to a first terminal of the n-type transistor T34, and a control terminal of the p-type transistor T32 and a control terminal of the n-type transistor T34 are collectively coupled to a first terminal of the n-type transistor T33. The n-type transistor T35 has a second terminal coupled to a ground voltage GND and a control terminal coupled to the reading enabling signal DE.

In FIG. 3B, before the reading operation is performed, the reading switch 310 is switched on by the pre-charging signal PB to perform a pre-charging operation on the bit line BL and the complementary bit line BLN. When the reading operation is about to be performed, the reading switch 310 is switched off by the pre-charging signal PB to end the pre-charging operation. At the same time, a selection signal CSL configured to select memory cells of the memory cell array 110 is changed from logic low to logic high, so as to read the data MD of the selected memory cells. The reading enabling signal DE is then switched to logic high to switch on the reading switch 310 and activate the amplifier 332 to amplify the data signal MDiT and the phase-inverting data signal MDiN, so as to output the reading data signal ADiT, the phase-inverting reading data signal ADiN, and the reading bit signal RDi. The low voltage VSS in FIG. 3B is, for instance, the ground voltage GND.

With reference to FIG. 4, the data correction circuit 220 includes a parity switch 410, a reading bit latch 420, a parity circuit 430, and an output circuit 440. An input terminal of the parity switch 410 receives the read data ADi from the data reading circuit 210 and is controlled by a reading latch signal LAR to be switched on or off. The reading bit latch 420 is coupled to the parity switch 410 and configured to latch the read data ADi. The parity circuit 430 is coupled to the reading bit latch 420, receives the corresponding error decoding signal SDi, and is configured to correct the bit stored in the reading bit latch 420 according to the error decoding signal SDi. The output circuit 440 is coupled to the parity circuit 430 and the reading bit latch 420 and controlled by an output enabling signal OE to output the bit stored in the reading bit latch 420 as the data output signal RWBi.

In the parity switch 410 shown in FIG. 4, a transmission gate TG3 receives the reading data signal ADiT from the data reading circuit 210, a transmission gate TG4 receives the phase-inverting reading data signal ADiN from the data reading circuit 210, and the transmission gate TG3 and the transmission gate TG4 are both controlled by the reading latch signal LAR. A phase inverter INV5 has an input terminal receiving the reading latch signal LAR and an output terminal collectively coupled to one control terminal of one of the transmission gate TG3 and the transmission gate TG4, so as to provide a phase-inverting signal of the reading latch signal LAR.

The reading bit latch 420 includes a phase inverter INV6 and a phase inverter INV7. The phase inverter INV6 has an input terminal which is coupled to an output terminal of the phase inverter INV7 and receives the reading data signal ADiT through the transmission gate TG3. The phase inverter INV7 has an input terminal which is to an output terminal of the phase inverter INV6 and receives the phase-inverting reading data signal ADiN through the transmission gate TG4.

In the parity circuit 430, a phase inverter INV8 receives the error decoding signal SDi, and a phase inverter INV9 is coupled to the output terminal of the phase inverter INV8 to output the correction bit signal CSi. A p-type transistor TP4 has a first terminal coupled to the supply voltage VDD, a second terminal coupled to a first terminal of a p-type transistor TP5, and a control terminal coupled to an output terminal of the phase inverter INV8. The p-type transistor TP5 has a second terminal coupled to the input terminal of the phase inverter INV6 and a control terminal receiving the reading data signal ADiT. A p-type transistor TP6 has a first terminal coupled to the supply voltage VDD, a second terminal coupled to a first terminal of a p-type transistor TP7, and a control terminal coupled to the output terminal of the phase inverter INV8. The p-type transistor TP7 has a second terminal coupled to the output terminal of the phase inverter INV6 and a control terminal receiving the phase-inverting reading data signal ADiN.

In the output circuit 440, an input terminal of a phase inverter INV10 is coupled to the output enabling signal OE. An NAND gate NAND1 has a first input terminal coupled to the second terminal of the p-type transistor TP5 and a second input terminal receiving the output enabling signal OE. An NOR gate NOR1 has a first input terminal coupled to the second terminal of the p-type transistor TP5 and a second input terminal coupled to an output terminal of the phase inverter INV10. A p-type transistor TP8 has a first terminal coupled to the supply voltage VDD and a control terminal coupled to an output terminal of the NAND gate NAND1; an n-type transistor TN1 has a first terminal coupled to a second terminal of the p-type transistor TP8 and providing the corrected data output signal RWBi, a control terminal coupled to an output terminal of the NOR gate NOR1, and a second terminal coupled to the ground voltage GND. The output circuit 440 can further include a latch 442 coupled to the first terminal of the n-type transistor TN1. The circuit structure of the latch 442 is the same as that of the reading bit latch 420, i.e., formed by connecting two phase inverters INV.

With reference to FIG. 3B again, when the reading latch signal LAR is switched to logic high, the reading bit latch 420 receives the read data ADi to latch the bit value thereof and generates a corresponding positive latch bit signal EiT and a corresponding negative latch bit signal EiN. In FIG. 3B, in a period during which the reading latch signal LAR is at the logic high level, the positive latch bit signal EiT is changed to logic low, and the negative latch bit signal EiN is changed to logic high. After the reading latch signal LAR is switched to logic low, if the $i^{th}$ bit of the data MD is the error bit, the error decoding signal SDi from the syndrome decoding circuit 160 is switched to logic high. In the same reading period, the parity circuit 430 inverts the error bit value latched by the reading bit latch 420 according to the error decoding signal SDi, and therefore the positive latch bit signal EiT and the negative latch bit signal EiN are inverted to correct the error. The output circuit 440 then outputs the corrected data output signal RWBi according to the output enabling signal OE.

With reference to FIG. 5A, the data writing circuit 230 includes a phase inverter INV11, a writing switch 510, a writing switch 520, a writing bit latch 530, and an output circuit 540. An input terminal of the phase inverter INV11 receives the corresponding data output signal RWBi. An input terminal of the writing switch 510 is coupled to an output terminal of the phase inverter INV11 and controlled by a first writing latch signal LAWm to be switched on or off. An input terminal of the writing switch 520 receives the corresponding correction bit signal CSi and controlled by a second writing latch signal LDWm to be switched on or off. Here, m is an integer from 0-7 and represents the corresponding mask bit. The writing bit latch 530 is coupled to an output terminal of the writing switch 510 and an output terminal of the writing switch 520, and the output circuit 540 is coupled to the output terminal of the writing switch 520 and the writing bit latch 530. The output circuit 540 is controlled by a writing enabling signal WE and writes the data output signal RWBi or the correction bit signal CSi into the memory cell array 110.

Here, the data signal MDiT and the phase-inverting data signal MDiN output by the output circuit 540 can be respectively transmitted back to the bit line and the complementary bit line of the memory cell array 110, so as to rewrite the data MDi.

In FIG. 5A, the writing switch 510 is implemented in form of a transmission gate TG5, and the writing switch 520 is implemented in form of a transmission gate TG6. Two control terminals of the transmission gate TG5 respectively receive the corresponding first writing latch signal LAWm and a phase-inverting signal of the first writing latch signal LAWm (i.e., a phase-inverting first writing latch signal LAWmB), and two control terminals of the transmission gate TG6 respectively receive the second writing latch signal LDWm and a phase-inverting signal of the second writing latch signal LDWm (i.e., a phase-inverting second writing latch signal LDWmB).

The writing bit latch 530 includes a phase inverter INV12 and a phase inverter INV13. An input terminal of the phase inverter INV12 is coupled to an output terminal of the phase inverter INV13, and an input terminal of the phase inverter INV13 is coupled to an output terminal of the phase inverter INV12, wherein the input terminal of the phase inverter INV12 is collectively coupled to an output terminal of the transmission gate TG5 and an output terminal of the transmission gate TG6.

In the output circuit 540, a phase inverter INV14 is serially connected to a phase inverter INV15, and the phase inverter INV14 receives the writing enabling signal WE. An NAND gate NAND2 has a first input terminal coupled to the output terminal of the phase inverter INV12 and a second input terminal coupled to an output terminal of the phase inverter INV15, and an NOR gate NOR2 has a first input terminal coupled to the output terminal of the phase inverter INV12 and a second input terminal coupled to an output terminal of the phase inverter INV14. A p-type transistor TP9 has a first terminal coupled to the supply voltage VDD and a control terminal coupled to an output terminal of the NAND gate NAND2, and an n-type transistor TN2 has a first terminal that is coupled to a second terminal of the p-type transistor TP9 and provides the corresponding data signal MDiT, a control terminal coupled to an output terminal of the NOR gate NOR2, and a second terminal coupled to the ground voltage GND. An NAND gate NAND3 has a first input terminal coupled to the output terminal of the phase inverter INV13 and a second input terminal coupled to the output terminal of the phase inverter INV15. An NOR gate NOR3 has a first input terminal coupled to the output terminal of the phase inverter INV13 and a second input terminal coupled to the output terminal of the phase inverter INV14. A p-type transistor TP10 has a first terminal coupled to the supply voltage VDD and a control terminal coupled to an output terminal of the NAND gate NAND3, and an n-type transistor TN3 has a first terminal that is coupled to a second terminal of the p-type transistor TP10 and provides the corresponding phase-inverting data signal MDiN, a control terminal coupled to an output terminal of the NOR gate NOR3, and a second terminal coupled to the ground voltage GND.

With reference to FIG. 5B, the data writing circuit 230 further includes a control signal generating circuit 550 that generates the first writing latch signal LAWm and the second writing latch signal LDWm according to an initial writing latch signal LAW and a writing mask signal DM. In this embodiment, the writing mask signal DM is an 8-bit signal; therefore, a writing mask signal DMm represents a signal corresponding to the $m^{th}$ bit, and m is an integer from 0 to 7.

The control signal generating circuit 550 provides a checking writing latch signal LAWPT and a phase-inverting checking writing latch signal LAWPB to the parity data read-write circuit 140 and provides the corresponding first writing latch signal LAWm, the corresponding second writing latch signal LDWm, and their phase-inverting signals to the data writing circuit 230.

The control signal generating circuit 550 includes a phase inverter INV16, a phase inverter INV17, a phase inverter INV18, and a signal generating circuit 610. The phase inverter INV16 and the phase inverter INV17 are serially connected, an input terminal of the phase inverter INV16 receives the initial writing latch signal LAW, and the phase inverter INV17 outputs the checking writing latch signal LAWPT to the parity data read-write circuit 140, wherein the phase inverter INV18 receives the initial writing latch signal LAW to output the phase-inverting checking writing latch signal LAWPB.

During the reading operation, note that the writing enabling signal WE and the initial writing latch signal LAW stay logic low.

In the signal generating circuit 610 shown in FIG. 5B, an output terminal of the phase inverter INV19 receives the corresponding writing mask signal DMm. An NAND gate NAND4 has a first input terminal receiving the initial writing latch signal LAW, a second input terminal coupled to the output terminal of the phase inverter INV19, and an output terminal outputting a corresponding phase-inverting first writing latch signal LAWmB. A phase inverter INV20 has an input terminal coupled to the output terminal of the NAND gate NAND4 to output the corresponding first writing latch signal LAWm. An NAND gate NAND5 has a first input terminal receiving the initial writing latch signal LAW, a second input terminal receiving the corresponding writing mask signal DMm, and an output terminal outputting a corresponding phase-inverting second writing latch signal LDWmB. A phase inverter INV21 has an input terminal coupled to the output terminal of the NAND gate NAND5 to output the corresponding second writing latch signal LDWm.

Figure 6A:
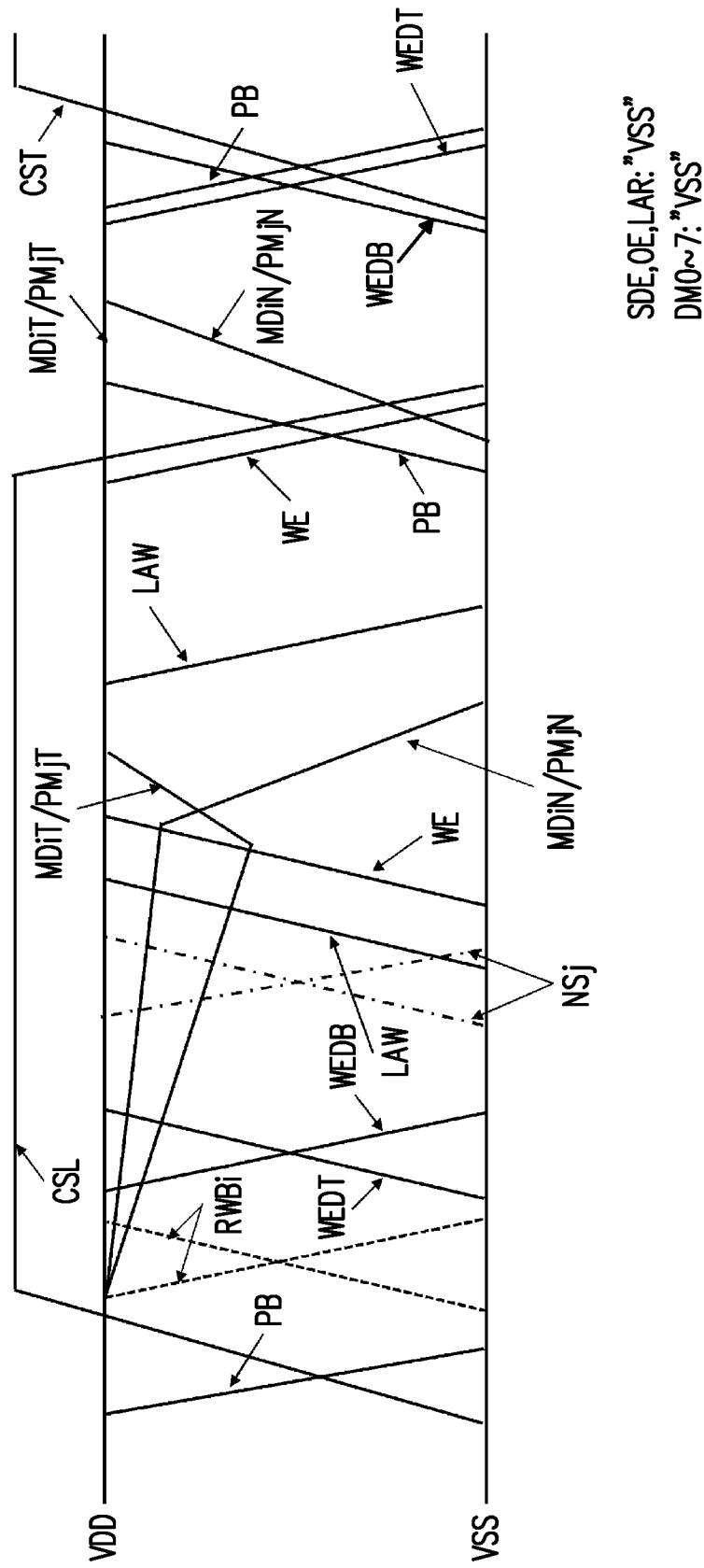
FIG. 6A is a schematic diagram illustrating a waveform of a writing operation of a memory apparatus according to an embodiment of the disclosure while no error bit is found.
Figure 6B:
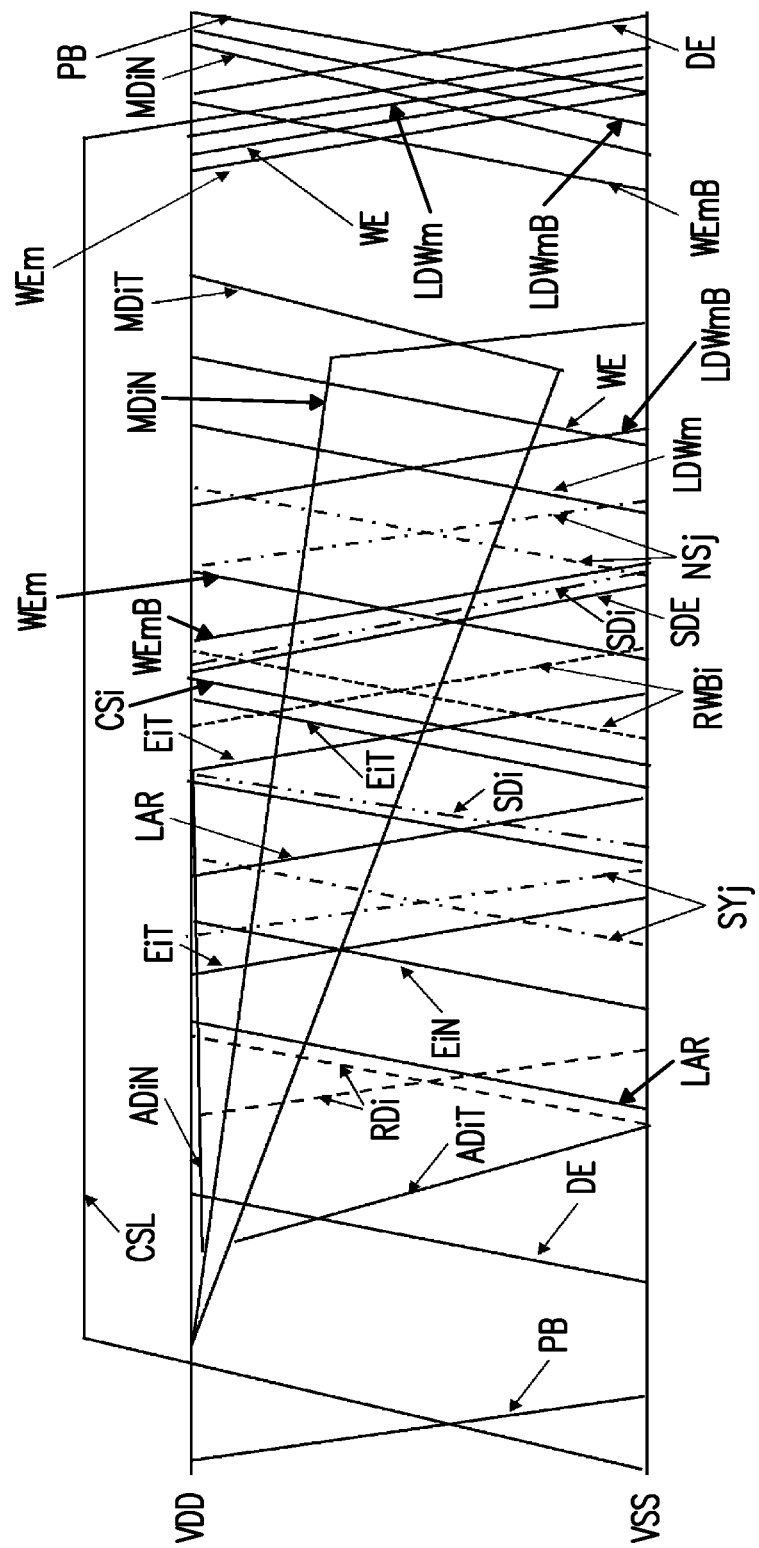
FIG. 6B is a schematic diagram illustrating a waveform of a writing operation of a memory apparatus according to an embodiment of the disclosure while an error bit is being corrected.

FIG. 6A is a schematic diagram illustrating a waveform of a writing operation of a memory apparatus according to an embodiment of the disclosure while no error bit is found. FIG. 6B is a schematic diagram illustrating a waveform of a writing operation of a memory apparatus according to an embodiment of the disclosure while an error bit is being corrected. Please refer to FIG. 6A and FIG. 6B together with the previous embodiments.

In FIG. 6A, when the data MD are to be written into the memory apparatus 100, and when the to-be-written bit need not be corrected, an enabling time (e.g., a time at which the logic high level is maintained) configured to select a selection signal CSL of the memory cells is referred to as a normal writing time. In the normal writing time, the correction bit signal CS and the writing mask signal DM continuously stay logic low, the writing switch 510 is switched on while the writing switch 520 is switched off, and the data writing circuit 230 selects to write the data output signal RWBi into the memory cell array 110.

In FIG. 6B, after the memory apparatus 100 finds the error bit in the data MD, and when the data writing circuit 230 is to write back the corrected data back, the enabling time of the selection signal CSL is referred to as a parity writing time. In the parity writing time, after the reading latch signal LAR is switched to a logic low level, the logic level of the decoding signal SDi corresponding to the error bit location is changed to a logic high level; correspondingly, the correction bit signal CSi output by the data correction circuit 220 is switched to a logic high level. Note that the syndrome generating circuit 150 also correspondingly outputs the parity data writing signal NS to the parity data read-write circuit 140, so as to update the parity data PM.

The data writing circuit 230 then performs a writing operation, the corresponding first writing latch signal LAWm switches off the writing switch 510, and the corresponding second writing latch signal LDWm switches on the writing switch 520, so that the correction bit signal CSi in replacement of the data output signal RWBi is input to the output circuit 540 to write the corrected bit value in the enabling time of the writing enabling signal WE.

In brief, if the to-be-written bit is correct, the data writing circuit 230 writes the data output signal RWBi into the memory cell array 110; if the to-be-written bit is the error bit, the data writing circuit 230 writes the correction bit signal CSi into the memory cell array 110.

According to this embodiment, note that the enabling time of the selection signal CSL can be changed, and the parity writing time is longer than the normal writing time. When the memory apparatus 100 finds out the error bit, the data read-write circuit 130 and the parity data read-write circuit 140 can write the corrected data back to the memory cell array 110 and update the parity data PM in the same period of performing the correction operation through extending the enabling time of the selection signal CSL. That is, the selection signal CSL only need be enabled once, and the checking, correction, and updating operations can be completed.

Figure 7A:
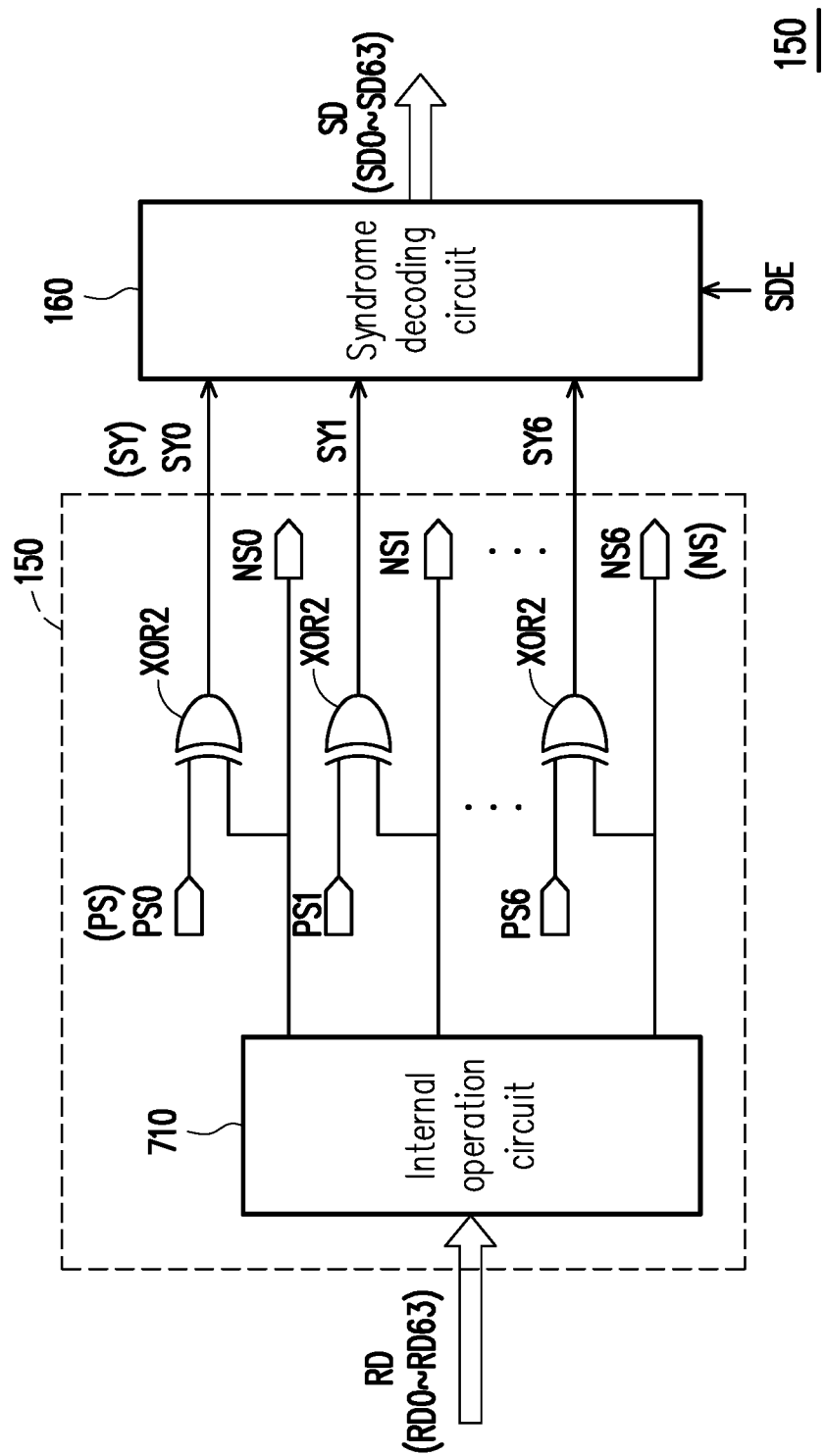
FIG. 7A is a schematic circuit diagram illustrating a syndrome generating circuit according to an embodiment of the disclosure.
Figure 7B:
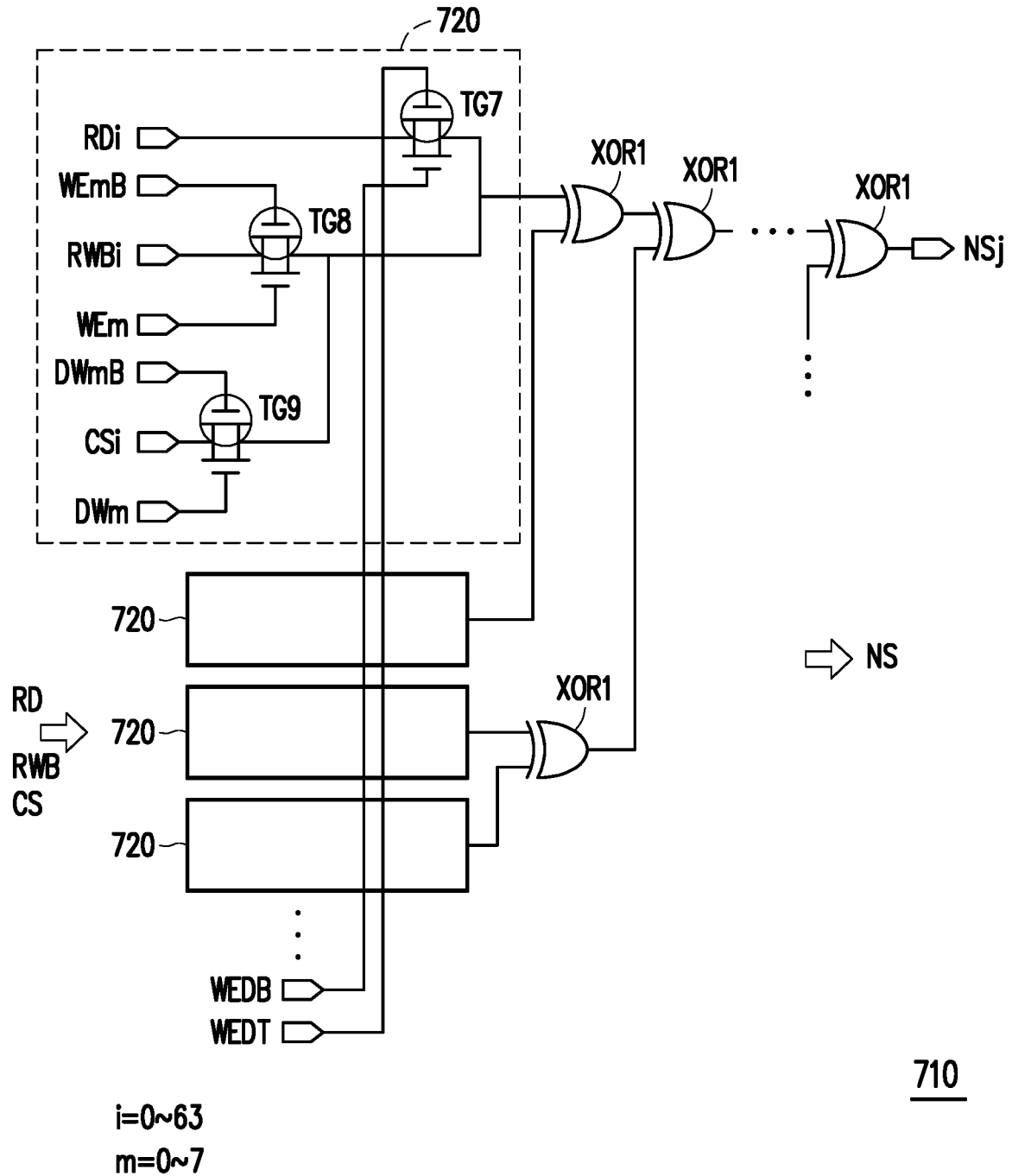
FIG. 7B is a schematic circuit diagram of an internal operation circuit of a syndrome generating circuit according to an embodiment of the disclosure.
Figure 7C:
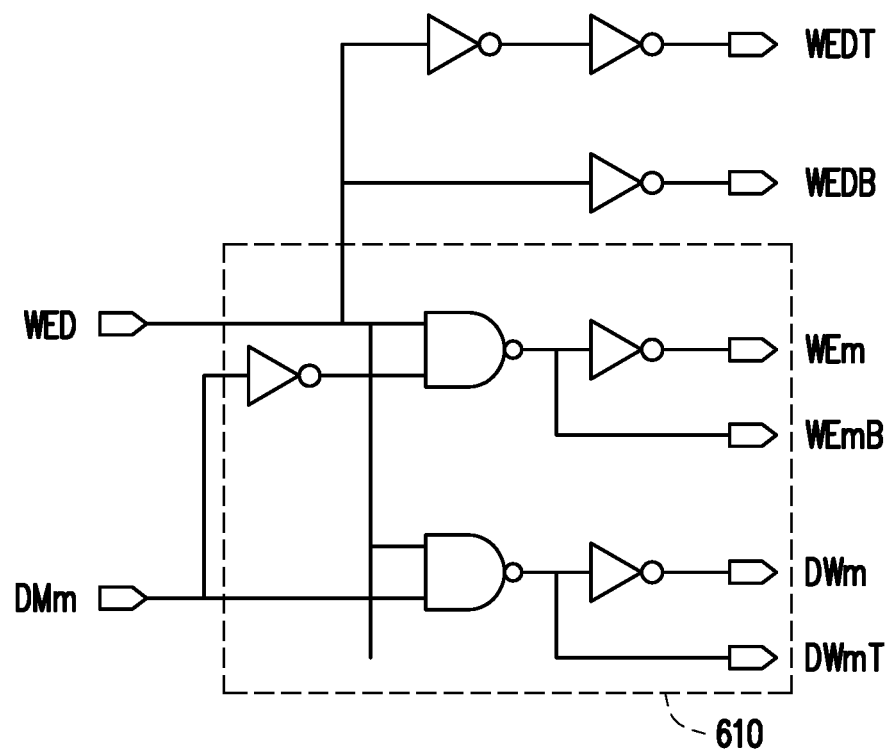
FIG. 7C is a schematic circuit diagram illustrating a syndrome control signal generating circuit of a syndrome generating circuit according to an embodiment of the disclosure.

The detailed circuit structure of the syndrome generating circuit 150 is then explained hereinafter. FIG. 7A is a schematic circuit diagram illustrating a syndrome generating circuit according to an embodiment of the disclosure. FIG. 7B is a schematic circuit diagram of an internal operation circuit of a syndrome generating circuit according to an embodiment of the disclosure. FIG. 7C is a schematic circuit diagram illustrating a syndrome control signal generating circuit of a syndrome generating circuit according to an embodiment of the disclosure.

With reference to FIG. 7A, the syndrome generating circuit 150 includes an internal operation circuit 710 and a plurality of XOR gates XOR2, wherein the internal operation circuit 710 includes a plurality of transmission gates TG (e.g., transmission gates TG7-TG9 shown in FIG. 7B) and a plurality of XOR gates XOR1.

In FIG. 7B, the internal operation circuit 710 selects to provide the data output signal RWB, the correction bit signal CS, or the reading bit signal RD to the XOR gates XOR1 through controlling the transmission gates TG, so as to output the parity data writing signal NS. Specifically, the internal operation circuit 710 has a plurality of input circuits 720. Each of the input circuits 720 not only receives the corresponding data output signal RWBi but also receives the corresponding reading bit signal RDi from the data reading circuit 210 and receives the corresponding correction bit signal CSi from the data correction circuit 220. The internal operation circuit 710 selects to input one of the reading bit signal RD, the data output signal RWB, and the correction bit signal CS to the corresponding XOR gate XOR1 through controlling the transmission gates TG7-TG9 in the input circuits 720.

Specifically, the transmission gate TG7 receives the corresponding reading bit signal RDi and is controlled by a writing data control signal WED and a phase-inverting signal WEDB of the writing data control signal WED, the transmission gate TG8 receives the data output signal RWBi and is controlled by a writing data selection signal WEm and a phase-inverting signal WEmB of the writing data selection signal WEm, and the transmission gate TG9 receives the correction bit signal CSi and is controlled by a writing mask selection signal DWm and a phase-inverting signal DWmB of the writing mask selection signal DWm.

When the memory apparatus 100 performs the reading operation, the input circuits 720 select to receive the reading bit signal RDi, switch on the transmission gate TG7, and switch off the transmission gate TG8 and the transmission gate TG9; when the memory apparatus 100 performs the writing operation, the input circuits 720 switch off the transmission gate TG7 and switch on the transmission gate TG8 or the transmission gate TG9 according to the writing mask signal DM, so as to select to receive the data output signal RWBi or the correction bit signal CSi.

After multi-level operations of the XOR gates XOR1, the internal operation circuit 710 outputs the parity data writing signal NSj, wherein j is an integer from 0 to 6 because the parity bit provided in the present embodiment is 7, and the parity data writing signal NSj represents a signal of the parity data writing signal NS corresponding to the $j^{th}$ bit.

In FIG. 7A, XOR gates XOR2 receive the corresponding parity data writing signal NSj from the internal operation circuit 710 and receive the corresponding parity reading signal PSj from the parity data read-write circuit 140. The syndrome generating circuit 150 compares the parity reading signal PS and the parity data writing signal NS to output the syndrome signal SY. The syndrome decoding circuit 160 receives the syndrome signal SY and a decoding control signal SDE and performs a decoding operation on the syndrome signal SY, so as to output the error decoding signal SD to the data correction circuit 220 of the data read-write circuit 130.

The syndrome generating circuit 150 further includes a syndrome control signal generating circuit 730 configured to generate a control signal of the transmission gates TG. The circuit structure of the syndrome control signal generating circuit 730 depicted in FIG. 7C is similar to that of the control signal generating circuit 550 depicted in FIG. 5B, and therefore the operation details of the syndrome control signal generating circuit 730 will not be explained hereinafter.

Figure 8:
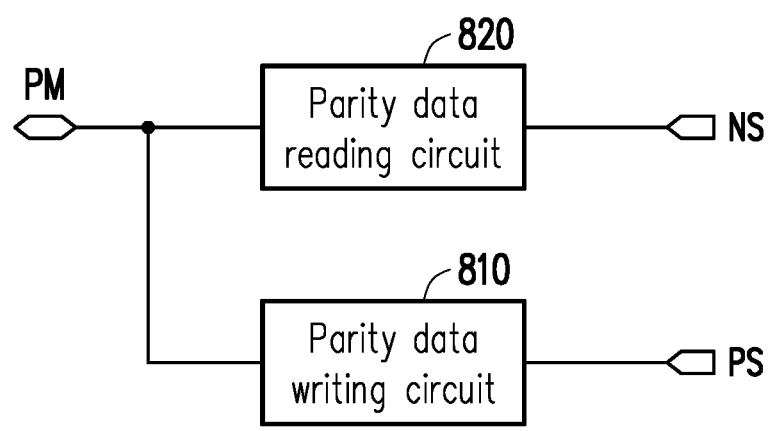
FIG. 8 is a schematic circuit diagram illustrating a parity data read-write circuit according to an embodiment of the disclosure.
Figure 9:
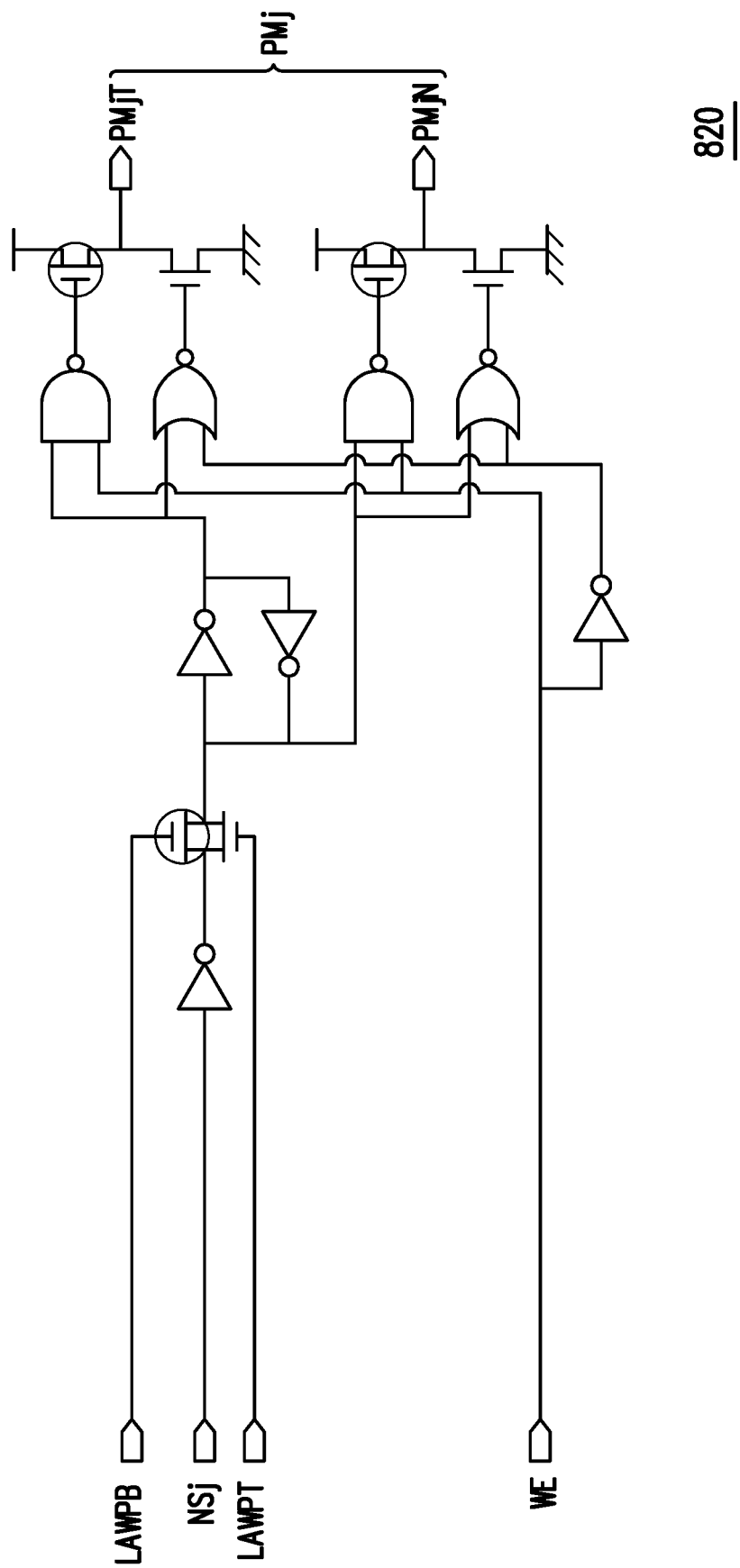
FIG. 9 is a schematic circuit diagram illustrating a parity data writing circuit according to an embodiment of the disclosure.

The specific circuit structure of the parity data read-write circuit 140 is explained hereinafter. FIG. 8 is a schematic circuit diagram illustrating a parity data read-write circuit according to an embodiment of the disclosure. FIG. 9 is a schematic circuit diagram illustrating a parity data writing circuit according to an embodiment of the disclosure.

With reference to FIG. 8, the parity data read-write circuit 140 includes a parity data reading circuit 810 and the parity data writing circuit 820. The parity data reading circuit 810 is coupled to the parity memory cell array 120 and the syndrome operation circuit 170 and configured to read the parity data PM from the parity memory cell array 120 to output the parity reading signal PS to the syndrome generating circuit 150 of the syndrome operation circuit 170. The parity data writing circuit 820 is coupled to the parity memory cell array 120 and the syndrome generating circuit 150 of the syndrome operation circuit 170 and configured to write the corrected parity data PM into the parity memory cell array 120.

When the memory apparatus 100 performs the reading operation, the parity data reading circuit 810 can read the parity data PM from the parity memory cell array 120 to output the parity reading signal PS to the syndrome generating circuit 150. According to the parity reading signal PS, the syndrome generating circuit 150 checks whether there exists any error bit in the reading bit signal RD. If there exists any error bit, the corresponding error decoding signal SDi changes the logic level. In this embodiment, if the $i^{th}$ bit of the data MD is the error bit, the error decoding signal SDi is changed to logic high, as shown in FIG. 3B.

The details of the parity data reading circuit 810 can be referred to as those depicted in FIG. 3A, and people having ordinary skill in the art can obtain sufficient suggestions, teachings, and implementation manner from the data reading circuit 210. Hence, no other explanation is provided hereinafter.

The details of the parity data writing circuit 820 are shown in FIG. 9, and the circuit structure of the parity data writing circuit 820 is similar to that of the data writing circuit 230 depicted in FIG. 5A. Since people having ordinary skill in the art can obtain sufficient suggestions, teachings, and implementation manner from the data writing circuit 230, no other explanation is provided hereinafter.

With reference to FIG. 6B, when the syndrome generating circuit 150 checks and finds the error bit in the reading bit signal RD, the data writing circuit 230 performs an error correction operation on the reading bit signal RD, and the syndrome generating circuit 150 outputs the new parity data writing signal NS according to the correction bit signal CS recording the error bit location. The parity data writing circuit 820 writes the new parity data writing signal NS into the parity memory cell array 120 to update the parity data PM. The parity data PM depicted in FIG. 9 include a differential signal of a parity data signal PMjT and a phase-inverting parity data signal MjN, and j is an integer from 0 to 6 and represents the corresponding parity bit.

To sum up, the memory apparatus provided herein can read the data from the memory cell array and perform the checking operation in one reading period. When one error bit is found from the data, the memory apparatus provided herein can instantly correct the error and output the corrected data in the same reading period. Besides, the memory apparatus provided herein can simultaneously output the correction bit signal to the data writing circuit and the syndrome generating circuit. Through extending the enabling time of the selection signal, the data writing circuit can write the corrected data back to the memory cell array, and the syndrome generating circuit provide the new parity data writing signal to the parity data writing circuit, so as to update the parity data. As such, one enabling time of the selection signal is provided to the memory cells where data are to be written only need be enabled once, and the checking, correction, and the data correction and updating operations can be completed to achieve the effects of instantly checking and correcting the error bit.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory apparatus comprising:
   a data read-write circuit coupled to a memory cell array and configured to access data in the memory cell array;
   a parity data read-write circuit coupled to a parity memory cell array and configured to access parity data in the parity memory cell array;
   a syndrome operation circuit configured to generate an error decoding signal according to the data received from the data read-write circuit and the parity data received from the parity data read-write circuit,
   wherein during a same reading period as reading the data, the data read-write circuit corrects an error bit of the data and outputs the corrected data and a correction bit signal according to the error decoding signal, wherein the data read-write circuit writes the corrected data back to the memory cell array, wherein the syndrome operation circuit further outputs a parity data writing signal to the parity data read-write circuit according to the correction bit signal, so as to update the parity data in the parity memory cell array.

2. The memory apparatus according to claim 1, wherein when the corrected data are being written into the memory cell array, an enabling time for selecting a selection signal of memory cells is referred to as a parity writing time, and when the data where no error bit is found are to be written into the memory cell array, the enabling time of the selection signal is referred to as a normal writing time, wherein the parity writing time is longer than the normal writing time.

3. The memory apparatus according to claim 1, wherein the data read-write circuit comprises:
   a data reading circuit coupled to the memory cell array and configured to read the data from the memory cell array to generate read data and a corresponding reading bit signal;
   a data correction circuit coupled to the data reading circuit and the syndrome operation circuit, configured to latch the read data in the reading period, and corrects an error bit of the read data according to the error decoding signal, so as to generate a data output signal and the correction bit signal, wherein the data output signal is an output result obtained from reading and correcting the data by the data read-write circuit; and
   a data writing circuit coupled to the data correction circuit and the memory cell array and configured to replace the data output signal corresponding to the error bit with the correction bit signal, so as to write the corrected data back to the memory cell array.

4. The memory apparatus according to claim 3, wherein the data reading circuit comprises:
   a reading switch having an input terminal receiving the data from the memory cell array and controlled by a reading enabling signal to be switched on or off;
   a pre-charging circuit coupled to the input terminal of the reading switch and controlled by a pre-charging signal, so as to perform a pre-charging operation on the input terminal of the reading switch; and
   an amplification circuit having an input terminal coupled to an output terminal of the reading switch, controlled by the reading enabling signal to generate the read data, and generating the corresponding reading bit signal.

5. The memory apparatus according to claim 4, wherein the reading switch comprises:
   a first transmission gate and a second transmission gate, wherein the first transmission gate is coupled to a bit line to receive a data signal, the second transmission gate is coupled to a complementary bit line to receive a phase-inverting data signal, and the first transmission gate and the second transmission gate are both controlled by the reading enabling signal, wherein the data comprise a differential signal of the phase-inverting data signal and the data signal; and
   a first phase inverter and a second phase inverter, wherein an input terminal of the first phase inverter receives the reading enabling signal, an output terminal of the first phase inverter is collectively coupled to one of control terminals of the first transmission gate and the second transmission gate, an input terminal of the second phase inverter is coupled to the output terminal of the first phase inverter, and an output terminal of the second phase inverter is coupled to the other control terminal of the first transmission gate and the second transmission gate;

the pre-charging circuit comprises:
   a third phase inverter receiving the pre-charging signal;
   a first p-type transistor having a first terminal coupled to a supply voltage, a control terminal coupled to an output terminal of the third phase inverter, and a second terminal coupled to the bit line;
   a second p-type transistor having a first terminal coupled to the supply voltage, a control terminal coupled to the output terminal of the third phase inverter, and a second terminal coupled to the complementary bit line; and
   a third p-type transistor coupled between the second terminal of the first p-type transistor and the second terminal of the second p-type transistor and having a control terminal coupled to the output terminal of the third phase inverter; and the amplification circuit comprises:
   an amplifier coupled to the reading switch to receive the data signal and the phase-inverting data signal and correspondingly output a reading data signal and a phase-inverting reading data signal, wherein the read data comprise a differential signal of the reading data signal and the phase-inverting reading data signal; and
   a fourth phase inverter receiving the phase-inverting reading data signal to output the reading bit signal.

6. The memory apparatus according to claim 3, wherein the data correction circuit comprises:
   a parity switch having an input terminal receiving the read data from the data reading circuit and controlled by a reading latch signal to be switched on or off;
   a reading bit latch coupled to the parity switch and configured to latch the read data;
   a parity circuit coupled to the reading bit latch, receiving the error decoding signal, and configured to correct a bit stored in the reading bit latch according to the error decoding signal; and
   a first output circuit coupled to the parity circuit and the reading bit latch and controlled by an output enabling signal to output the bit stored in the reading bit latch as the data output signal.

7. The memory apparatus according to claim 6, wherein the parity switch comprises:
   a third transmission gate and a fourth transmission gate, wherein the third transmission gate receives a reading data signal from the data reading circuit, the fourth transmission gate receives a phase-inverting read data signal from the data reading circuit, and the third transmission gate and the fourth transmission gate are both controlled by a reading latch signal, wherein the read data comprise a differential signal of the reading data signal and the phase-inverting reading data signal; and
a fifth phase inverter having an input terminal receiving the reading latch signal and an output terminal collectively coupled to one of control terminals of the third transmission gate and the fourth transmission gate; and
the reading bit latch comprises:
a sixth phase inverter and a seventh phase inverter, wherein an input terminal of the sixth phase inverter is coupled to an output terminal of the seventh phase inverter and receives the reading data signal through the third transmission gate, and an input terminal of the seventh phase inverter is coupled to an output terminal of the sixth phase inverter and receives the phase-inverting reading data signal through the fourth transmission gate.

8. The memory apparatus according to claim 7, wherein the parity circuit comprises:
an eighth phase inverter receiving the error decoding signal;
a ninth phase inverter coupled to the output terminal of the sixth phase inverter to output the correction bit signal;
a fourth p-type transistor and a fifth p-type transistor, wherein a first terminal of the fourth p-type transistor is coupled to a supply voltage, a second terminal of the fourth p-type transistor is coupled to a first terminal of the fifth p-type transistor, a control terminal of the fourth p-type transistor is coupled to an output terminal of the eighth phase inverter, a second terminal of the fifth p-type transistor is coupled to the input terminal of the sixth phase inverter, and a control terminal of the fifth p-type transistor receives the reading data signal; and
a sixth p-type transistor and a seventh p-type transistor, wherein a first terminal of the sixth p-type transistor is coupled to the supply voltage, a second terminal of the sixth p-type transistor is coupled to a first terminal of the seventh p-type transistor, a control terminal of the sixth p-type transistor is coupled to the output terminal of the eighth phase inverter, a second terminal of the seventh p-type transistor is coupled to the output terminal of the sixth phase inverter, and a control terminal of the seventh p-type transistor receives the phase-inverting reading data signal.

9. The memory apparatus according to claim 8, wherein the first output circuit comprises:
a tenth phase inverter having an input terminal coupled to the output enabling signal;
a first NAND gate having a first input terminal coupled to the second terminal of the fifth p-type transistor and a second input terminal receiving the output enabling signal;
a first NOR gate having a first input terminal coupled to the second terminal of the fifth p-type transistor and a second input terminal coupled to an output terminal of the tenth phase inverter;
an eighth p-type transistor having a first terminal coupled to the supply voltage and a control terminal coupled to an output terminal of the first NAND gate;
a first n-type transistor having a first terminal coupled to a second terminal of the eighth p-type transistor and providing the corrected data output signal, a control terminal coupled to the output terminal of the first NOR gate, and a second terminal coupled to a ground voltage.

10. The memory apparatus according to claim 3, wherein the data writing circuit comprises:
an eleventh phase inverter having an input terminal receiving the corresponding data output signal;
a first writing switch having an input terminal coupled to an output terminal of the eleventh phase inverter and controlled by a first writing latch signal to be switched on or off;
a second writing switch having an input terminal receiving the corresponding correction bit signal and controlled by a second writing latch signal to be switched on or off;
a writing bit latch coupled to an output terminal of the first writing switch and an output terminal of the second writing switch;
a second output circuit coupled to the output terminal of the second writing switch and the writing bit latch, controlled by a writing enabling signal, and writing the data output signal or the correction bit signal into the memory cell array.

11. The memory apparatus according to claim 10, wherein the first writing switch is a fifth transmission gate, and the second writing switch is a sixth transmission gate, and the writing bit latch comprises:
a twelfth phase inverter and a thirteenth phase inverter, wherein an input terminal of the twelfth phase inverter is coupled to an output terminal of the thirteenth phase inverter, an input terminal of the thirteenth phase inverter is coupled to an output terminal of the twelfth phase inverter, and the input terminal of the twelfth phase inverter is collectively coupled to an output terminal of the fifth transmission gate and an output terminal of the sixth transmission gate.

12. The memory apparatus according to claim 11, wherein the second output circuit comprises:
a fourteenth phase inverter and a fifteenth phase inverter, wherein the fourteenth phase inverter and the fifteenth phase inverter are serially connected, and the fourteenth phase inverter receives the writing enabling signal;
a second NAND gate having a first input terminal coupled to the output terminal of the twelfth phase inverter and a second input terminal coupled to an output terminal of the fifteenth phase inverter;
a second NOR gate having a first input terminal coupled to the output terminal of the twelfth phase inverter and a second input terminal coupled to an output terminal of the fourteenth phase inverter;
a ninth p-type transistor having a first terminal coupled to the supply voltage and a control terminal coupled to an output terminal of the second NAND gate;
a second n-type transistor having a first terminal coupled to a second terminal of the ninth p-type transistor and providing a corresponding data signal, a control terminal coupled to an output terminal of the second NOR gate, and a second terminal coupled to a ground voltage;
a third NAND gate having a first input terminal coupled to the output terminal of the thirteenth phase inverter and a second input terminal coupled to the output terminal of the fifteenth phase inverter;
a third NOR gate having a first input terminal coupled to the output terminal of the thirteenth phase inverter and a second input terminal coupled to the output terminal of the fourteenth phase inverter;

a tenth p-type transistor having a first terminal coupled to the supply voltage and a control terminal coupled to an output terminal of the third NAND gate; and a third n-type transistor having a first terminal coupled to a second terminal of the tenth p-type transistor and providing a corresponding phase-inverting data signal, a control terminal coupled to an output terminal of the third NOR gate, and a second terminal coupled to the ground voltage, wherein the data comprise a differential signal of the data signal and the phase-inverting data signal.

13. The memory apparatus according to claim 12, wherein the data writing circuit further comprises a control signal generating circuit, the control signal generating circuit generates the first writing latch signal and the second writing latch signal according to an initial writing latch signal and a writing mask signal, and the control signal generating circuit comprises:

a sixteenth phase inverter, a seventeenth phase inverter, and an eighteenth phase inverter, wherein the sixteenth phase inverter and the seventeenth phase inverter are serially connected, an input terminal of the sixteenth phase inverter receives the initial writing latch signal, and the seventeenth phase inverter outputs a checking writing latch signal to the parity data read-write circuit, wherein the eighteenth phase inverter receives the initial writing latch signal to output a phase-inverting checking writing latch signal to the parity data read-write circuit; and a signal generating circuit comprising:
  a nineteenth phase inverter having an output terminal receiving the corresponding writing mask signal;
  a fourth NAND gate having a first input terminal receiving the initial writing latch signal, a second input terminal coupled to the output terminal of the nineteenth phase inverter, and an output terminal outputs a phase-inverting signal of the corresponding first writing latch signal;
  a twentieth phase inverter having an input terminal coupled to the output terminal of the fourth NAND gate to output the corresponding first writing latch signal;
  a fifth NAND gate having a first input terminal receiving the initial writing latch signal, a second input terminal receives the corresponding writing mask signal, and an output terminal outputs a phase-inverting signal of the corresponding second writing latch signal; and
  a twenty-first phase inverter having an input terminal coupled to the output terminal of the fifth NAND gate to output the corresponding second writing latch signal.

14. The memory apparatus according to claim 3, wherein the syndrome operating circuit comprises:

a syndrome generating circuit coupled to the data read-write circuit and the parity data read-write circuit, selecting to receive the data reading circuit or an output signal of the data correction circuit according to a reading operation or a writing operation to generate the parity data writing signal, and comparing the parity data writing signal with the corresponding parity data to generate a syndrome signal; and a syndrome decoding circuit coupled to the syndrome generating circuit and decoding the syndrome signal to generate the error decoding signal.

15. The memory apparatus according to claim 14, wherein when the data read-write circuit performs the reading operation, the syndrome generating circuit generates the parity data writing signal according to the reading bit signal, and when the data read-write circuit performs the writing operation, the syndrome generating circuit generates the parity data writing signal according to the correction bit signal or the data output signal.

16. The memory apparatus according to claim 14, wherein the parity data read-write circuit reads the parity data to output a parity reading signal to the syndrome generating circuit, and the syndrome generating circuit comprises:

an internal operation circuit comprising a plurality of transmission gates and a plurality of first XOR gate and controlling the plurality of transmission gates to select to provide the plurality of first XOR gates with the data output signal, the correction bit signal, or the reading bit signal, so as to output the parity data writing signal; and a plurality of second XOR gates receiving the parity data writing signal from the internal operation circuit and receiving the corresponding parity reading signal from the parity data read-write circuit to output the syndrome signal.

17. The memory apparatus according to claim 1, wherein the parity data read-write circuit comprises:

a parity data reading circuit coupled to the memory cell array and the syndrome operation circuit and configured to read the parity data from the parity memory cell array, so as to output a parity reading signal to the syndrome operation circuit; and a parity data writing circuit coupled to the parity memory cell array and the syndrome operation circuit and configured to write the corrected parity data into the parity memory cell array.

* * * * *